METHOD OF SPLICING SUPERCONDUCTIVE WIRES

Filed June 4, 1968

INVENTORS
MALCOLM L. KINTER
IRA WEISSMAN
BY Wm. J. Nolan
ATTORNEY

United States Patent Office 3,523,361
Patented Aug. 11, 1970

3,523,361
METHOD OF SPLICING SUPERCONDUCTIVE WIRES

Malcolm L. Kinter, Menlo Park, and Ira Weissman, Palo Alto, Calif., assignors to Varian Associates, Palo Alto, Calif., a corporation of California
Filed June 4, 1968, Ser. No. 734,277
Int. Cl. H02g *15/08;* H01v *11/00*
U.S. Cl. 29—599 9 Claims

ABSTRACT OF THE DISCLOSURE

A high field superconductive splice for hard compound superconductors and method of making same are disclosed. Two portions of high-field superconductive wire, having a superconductive material formed as a layer on the outside of a substrate wire, are spliced together by sandwiching between them a layer of particulated material containing the constituent elements of a high field compound superconductor. The sandwich construction is then pressed to compact the particulated material together and into intimate contact with the two superconductive layers to be spliced. The compacted splice is then reacted at high temperature in an inert atmosphere to form, in place, a high-field compound superconductive bridge between the two superconductive wires. In one embodiment, the exposed ends of the two $Nb_3Sn$ wire segments are embedded in a mixture of niobium and tin powders which are then compacted and reacted to produce the resultant $Nb_3Sn$ superconductive bridging material between the two wires.

DESCRIPTION OF THE PRIOR ART

Heretofore, high-field superconductive splices have been made for splicing high-field alloy superconductive wire. Such splices are readily accomplished by spot welding together the exposed ends of the alloy superconductive wire. However, this spot welding technique is not usable for providing high-field superconductive splices for the high-field compound superconductive wires, when such wires comprise a superconductive layer bonded onto a low melting point substrate wire. This class of high-field compound superconductors, such as $Nb_3Sn$, $V_3Ga$ and $V_3Si$, is characterized by being hard and brittle and by being highly reactive with oxygen in the atmosphere to form insulative oxide coatings. Attempts have been made to form high-field superconductive splices between such compound superconductors by, for example, ultrasonic welding, cold welding, and by the provision of a thin coating of low melting point superconductive solder between portions of the superconductive wire to be spliced. All of the aforementioned attempts to provide a high-field superconductive splice have been unsuccessful. Use of the low melting point superconductive solder, such as indium, lead or tin, provides a very low resistance but not a superconductive joint between the two superconductive wires to be joined, because these solder materials are characterized by a low critical field, thereby rendering such a joint unusable for splicing together high field superconductive magnet wire or for applications which require the splice to be located in a region of relatively high magnetic field intensity. Typically, care is taken to place such splices out of the main field of the magnet and in the lower intensity fringing field of the magnet. However, the fringing field of high field magnets can have a magnitude on the order of twenty kilogauss which, as stated above, is much above the critical field intensity for such low melting point type superconductors, such as indium, lead or tin.

High-field superconductive splices are necessary in the fabrication of extremely high-field superconductive solenoids to be operated in the persistent mode where the ends of the solenoid are connected together by means of a superconductive shunt such that the superconductive currents can continue to circulate through the closed circuit of the solenoid without loss. Such solenoids have been constructed of Nb-Zr high-field alloy superconductive wire with the ends of the solenoid wire spot welded together to form a superconductive splice and have produced fields up to 60 kilogauss in the persistent mode. However, it would be desirable to utilize high-field compound superconductive wire such as $Nb_3Sn$ which is capable of producing a magnetic field in excess of 100 kilogauss in the persistent mode if a suitable high-field superconductive splice could be found.

Closed loop superconductive solenoids of $Nb_3Sn$ material have been constructed. For example, such a solenoid is described in an article titled "Inductive Behavior of Superconducting Magnets," appearing in the Journal of Applied Physics, vol. 34, No. 11 of November 1963 at pp. 3226–3237. However, this prior closed coil geometry was not constructed from a compound superconductive wire in the sense that the wire was not a superconductor which was a chemical compound of several elements and which was capable of exhibiting high-field superconductivity prior to a final high temperature reaction step which takes place after the solenoid is wound. More particularly, the wire used in this prior solenoid comprised a niobium sleeve containing a mixture of niobium and tin powders. Thus, the wire in this state is not a compound superconductor. A joint was made by inserting the two open ends of the niobium sleeve containing the powder mixture into a niobium container filled with a mixture of niobium and tin powders. The entire coil geometry was then reacted to convert the mixed powders within the sleeve and niobium splice container into $Nb_3Sn$. While such a method can be employed for fabricating a niobium-tin superconductive solenoid operable in the persistent mode, this method of reacting the solenoid in place to convert the constituent powders into the superconductive material is entirely impractical for fabricating high-field solenoids.

Therefore, a need exists for a high-field superconductive splice for splicing high-field compound superconductive wire.

SUMMARY OF THE PRESENT INVENTION

The principal object of the present invention is the provision of a high-field superconductive splice for compound superconductive wire and methods of making same.

One feature of the present invention is a method for forming a superconductive splice between two high-field compound superconductive wires, wherein powders of the constituent elements of a high-field compound superconductor are compacted between and around exposed surfaces of the superconductive layers on two superconductive wire portions to be spliced and including the step of reacting the compacted material at high temperature in place between the two wire portions to form a high-field compound superconductive bridge between the two superconductive wires, thereby providing a high-field superconductive splice.

Another feature of the present invention is the same as the preceding feature wherein the high-field compound superconductive wire is $Nb_3Sn$ and the powders which are to be compacted and reacted comprise powders of Nb and Sn.

Another feature of the present invention is the same as the preceding feature wherein the Sn powder comprises between 4 and 16% by weight of the compacted powder and the compacted powders are reacted at a temperature between 930° C. and 1,000° C. in an inert atmosphere.

Another feature of the present invention is a high-field superconductive splice formed according to the method of any one or more of the preceding features.

Other features and advantages of the present invention will become apparent on the perusal of the following specification taken in connection with the accompanying drawings wherein:

DESCRIPTION OF THE PREFERRED EMBODIMENTS

Figure 1:
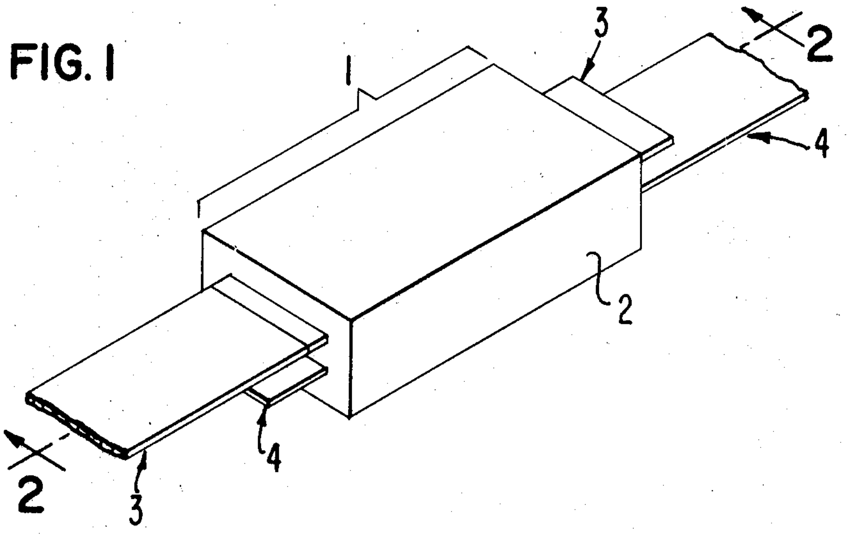
FIG. 1 is a perspective view of a high-field superconductive splice incorporating features of the present invention.

Referring now to FIG. 1, there is shown the high-field superconductive splice 1 for bridging together two high-field compound superconductors. The splice 1 includes a block body structure 2 of particulated material forming a high-field compound superconductive member fused together and fused to the first and second high-field compound superconductive wire member portions 3 and 4 which are embedded in the block body 2. The high-field compound superconductive block body 2 provides a high-field superconductive bridge between the two compound superconductive wire members portions 3 and 4.

As used herein, the term "high-field" is defined to mean a superconductive material having a critical magnetic field intensity greater than 20 kilogauss at 4.2° K. As used herein, "compound superconductor" is defined to mean a superconductive material which is essentially a compound as contrasted with an alloy. Examples of compound superconductors include $Nb_3Sn$, $V_3Ga$, and $V_3Si$, whereas alloy superconductors would include Nb-Zr and Mo-Re.

Figure 2:
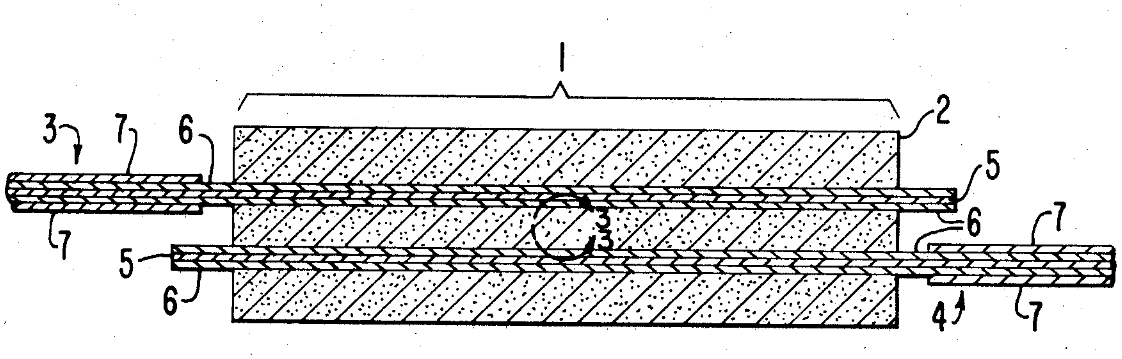
FIG. 2 is an enlarged sectional view of the structure of FIG. 1 taken along line 2—2 in the direction of the arrows.
Figure 3:
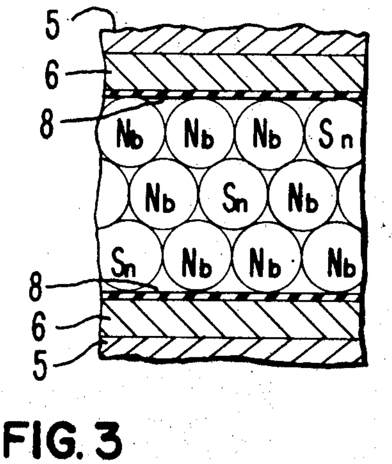
FIG. 3 is an enlarged detail view of a portion of the structure of FIG. 2 delineated by line 3—3 and depicting the powder composition before high temperature reaction.
Figure 4:
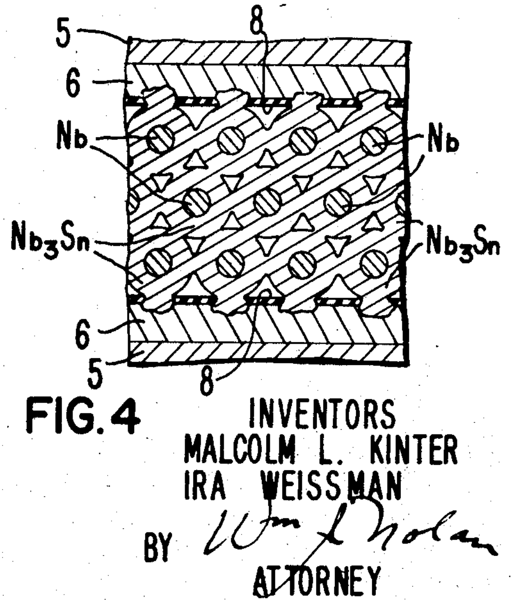
FIG. 4 is a view similar to that of FIG. 3 depicting the powder composition after high temperature reaction.

Referring now to FIGS. 2, 3 and 4, the superconductive splice of the present invention will be described in greater detail along with the method for making same. The two superconductive wire member portions 3 and 4, to be spliced, may take any one of a number of different forms and geometries. For example, such members may comprise the ends of two wires of circular cross section or, as in the case depicted, may comprise the ends of a ribbon-shaped superconductive wire. Such ribbon-shaped conductors are especially suitable for winding extremely high-field superconductive solenoids. For the particular case illustrated in the figures, the ribbon superconductor comprises a ribbon substrate member 5, as of a nickel-molybdenum alloy material, having a melting point of 1320° C. and commercially available from Haynes Stellite Co. of Kokomo, Ind., as Hastelloy Alloy B. In one example, the substrate ribbon 5 has a thickness of 0.002 inch and a width of 0.090 inch. A thin layer of high-field superconductive material 6 is formed on the substrate ribbon 5. The high-field superconductive layer material may comprise any one of a number of materials such as $Nb_3Sn$ deposited to a thickness as of 0.0003 inch on the substrate ribbon 5. A coating 7, of a nonsuperconductive metal such as silver or copper forms a conductive jacket over the superconductive layer 6. The conductive jacket 7 preferably has good thermal and electrical conductivities and, in the case of silver, is deposited to a thickness of 0.0005 inch over the superconductive layer 6.

In the region of the splice 1, the silver layer 7 is stripped from the ends of the superconductive wire member portions 3 and 4 to be spliced together, thereby exposing the superconductive layer 6 such that, in the region of the bond, an intimate electrical contact can be made to the superconductive layer 6. In making the splice 1, the exposed ends of the superconductive member 3 and 4 are overlapped 0.75 inch and spaced apart approximately 0.015 inch, in the cavity of a die which is filled with powder material containing the constituent elements of a high-field compound superconductor. For example, in the case of splicing $Nb_3Sn$ superconductive layers 6, the die is filled with Nb and Sn powders intimately mixed together and preferably having particle sizes less than 325 mesh screen. In the powder mixture, in the case of niobium and tin powders, contains between 4 and 16% by weight tin and preferably 8% tin by weight.

After embedding the superconductive wire member portion 3 and 4 in the powders, the powders are compacted into intimate contact with each other and with the superconductive layers 6 by subjecting the die containing the powders and the superconductive wire members 3 and 4 to compression in a hydraulic press. The powders are preferably compacted with a pressure falling within the range of 10,000 to 20,000 p.s.i. Upon compacting, the particles of the powders are mechanically locked together to form a body 2 of particulated material which has sufficient mechanical strength to be removed from the die and to retain its pressed shape. In this form, the splice body 2 can stand a limited amount of handling as required to transport the splice 1 to a furnace.

In the compacted state, before further treatment, a region of the splice between the two superconductive wire member portions 3 and 4 is depicted in greater detail in FIG. 3. More specifically, the mixture of niobium and tin powders are in intimate contact with a thin oxide layer 8 which has formed on the outside surface of the exposed ends of the $Nb_3Sn$ superconductive layer 6. This oxide layer 8 forms immediately upon exposure of the superconductive layer 6 to the earth's atmosphere since the $Nb_3Sn$ material is highly reactive with oxygen and water in the atmosphere, as are the other types of compound superconductors. Normally this oxide layer 8, without further treatment, would prevent the formation of a superconductive splice since the oxide layer is insulative and would prevent the formation of a superconductive bridge between the two superconductive layers 6.

Next, the splice 1 is inserted into a furnace in an inert gas atmosphere, as of helium gas, and reacted at high temperature to form a superconductive bridge between the superconductive layers 6. More specifically, in the case of niobium and tin powders, the splice is heated to a temperature above 930 degrees C. and preferably within the range of 950–960 degrees C. for approximately three minutes to form $Nb_3Sn$ high-field superconductive material bridging the gap between the two superconductive layers 6. It is believed that the tin, which has a relatively low melting point, reacts with the oxide layers 8 to break through the insulative layer 8 and that the Sn diffuses into the niobium particles and reacts to form $Nb_3Sn$ compound on the outside of all the intimately contacting niobium particles and to form an intimate $Nb_3Sn$ contact at the interface with the superconductive layers 6. The result is the formation of a high-field $Nb_3Sn$ compound superconductive bridge between the two $Nb_3Sn$ superconductive layers 6. The bridging structure retains its particulated form as depicted in FIG. 4.

A solenoid wound with the aforedescribed $Nb_3Sn$ ribbon and having its ends spliced together by means of the splice 1 has been successfully operated in the persistent mode to produce magnetic fields in excess of 17 kg. with a current of 69.9 amperes. No decay of the magnetic field was observed to within plus or minus 0.195 part per million per hour, thus indicating that the splice 1 is truly superconductive and suitable for producing extremely stable high intensity magnetic fields.

The particulated, reacted superconductive splice, as described above, may be utilized in a similar manner for splicing other types of high-field compound superconductive wire layers 6, such as $V_3Ga$ and $V_3Si$. The high-field compound superconductive bridge between the two superconductive layers 6 may be formed of other high-field compound superconductors, such as $V_3Ga$ or $V_3Si$, formed in a similar manner between the two superconductive members to be joined. More specifically, powders containing the constituent elements of a high-field compound superconductor are compacted in the space between the two superconductive members 3 and 4 to be joined. The compacted powders are reacted at high temperature in an in inert atmosphere to form the superconductive material in place between the two member portions 3 and 4 to be joined.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. In the method for forming a superconductive splice between two member portions of a high-field compound superconductive material the steps of, first sandwiching a layer of particulated material between the exposed surfaces of two high-field compound superconductive member portions to be spliced, the sandwiched particulated material containing the constituent elements of a high-field compound superconductor, then compacting the particulated material together into intimate contact with the two member portions to be spliced, and subsequently heating the compacted material in place between the two member portions to form a high-field compound superconductive splice therebetween.

2. The method of claim 1 wherein the compacted particulated material contains the same constituent elements as the constituent elements of the high-field compound superconductive member portion to be spliced together.

3. The method of claim 2 wherein the high-field compound superconductive material to be spliced is $Nb_3Sn$ and the particulated material which is to be compacted and heat treated comprises particles of Nb and Sn.

4. The method of claim 3 wherein the particles of Sn comprise between 4 and 16% by weight of the compacted particulated Nb and Sn material.

5. The method of claim 4 wherein the compacted Nb and Sn particles are heated to a temperature between 900° C. and 1000° C.

6. The method of claim 3 wherein the particles of Nb and Sn are compacted together and into intimate contact with the $Nb_3Sn$ material on the member portions to be spliced with a pressure within the range of 10,000 to 20,000 p.s.i.

7. In a method of forming a superconductive splice between two member portions of a high-field compound superconductive material, the steps of first sandwiching between facing surfaces of the two member portions the constituent elements of the compound superconductive material and thereafter reacting the elements to form a bridge of the compound superconductive material between the two member portions.

8. The method of claim 7 wherein said constituent elements are sandwiched in particulate form between said two member portions.

9. The method of claim 7 wherein said superconductive material is $Nb_3Sn$ and wherein the facing surfaces of said two member portions have oxide layers thereon and wherein a portion of the Sn sandwiched between said facing surfaces is reacted with said oxide.

References Cited

UNITED STATES PATENTS

| | | | |
|---|---|---|---|
| 3,309,457 | 3/1967 | Emery et al. | 174—94 |
| 3,422,529 | 1/1969 | Nuding | 29—599 |

DARRELL L. CLAY, Primary Examiner

U.S. Cl. X.R.

29—628; 174—94; 335—216